310-335 SR

XR 3,968,459

United Stat

Jacobson

[11] 3,968,459

[45] July 6, 1976

[54] ULTRASONIC DRIVER TRANSDUCER

[75] Inventor: Peter E. Jacobson, Phoenix, Ariz.

[73] Assignee: Sperry Rand Corporation, New York, N.Y.

[22] Filed: Jan. 29, 1975

[21] Appl. No.: 544,979

[52] U.S. Cl. .................................. 333/30 R; 310/8; 310/8.7

[51] Int. Cl.² ...................... H03H 9/04; H03H 9/10; H03H 9/14; H01L 41/10

[58] Field of Search ............... 333/30 R; 179/110 A; 310/9.8, 8.1, 8.2, 8.3, 8.4, 8.5, 8.6, 8.7, 8.8–9.1; 340/8 R, 8 MM, 8 L, 10; 73/67.5 R, 67.83, 71.5 US

[56] References Cited

UNITED STATES PATENTS

| | | | |
|---|---|---|---|
| 2,283,285 | 5/1942 | Pohlman | 340/8 MM X |
| 2,407,294 | 9/1946 | Shockley et al. | 310/8 X |
| 2,503,831 | 4/1950 | Mason | 310/8.7 X |
| 3,175,106 | 3/1965 | Sansom et al. | 73/67.8 X |
| 3,278,771 | 10/1966 | Fry | 310/8.3 |
| 3,497,728 | 2/1970 | Ostrofsky et al. | 310/8.1 X |
| 3,687,219 | 8/1972 | Langlois | 340/8 L X |

*Primary Examiner*—Alfred E. Smith
*Assistant Examiner*—Marvin Nussbaum
*Attorney, Agent, or Firm*—Howard P. Terry

[57] ABSTRACT

An ultrasonic driver transducer employs a piezoelectric element excited by pulsed carrier signals and generates a propagating ultrasonic wave focused in acoustically matched relation by a metal plano-concave lens through a liquid medium for collimated flow into a metal coupler output element and then into the external specimen or element that is to be excited by ultrasonic energy. Means are provided for filling internal cavities of the instrument with a liquid medium for propagating only the desired waves, along with means for purging entrapped gas from that interior medium.

13 Claims, 3 Drawing Figures

ULTRASONIC DRIVER TRANSDUCER

BACKGROUND OF THE INVENTION

1. Field of the Invention

The invention generally relates to instruments for the generation and use of ultrasonic energy and more particularly relates to such apparatus in which energetic ultrasonic waves are generated and efficiently coupled through a small area of entry into an object to be excited by such waves.

2. Description of the Prior Art

In the past, instruments have been widely devised for the generation of ultrasonic waves of high mechanical energy for industrial applications such as for cleaning, welding, and the like. While many of these devices operate with some success at moderate or high power levels, they are not readily useful for ultrasonic testing of precision instruments and especially for testing of small parts of such instruments, such as ball bearings. In testing applications, it is often desired that the ultrasonic energy be injected into a small surface of the small object to be tested as a flowing wave. It is also desirable that the carrier frequency of the ultrasonic wave be varied over a considerable range to enable study of resonance effects in the objects being tested. Many prior art ultrasonic drivers themselves exhibit interior multiple reflections or resonance effects with the consequent generation of nulls which shift location within the driver device as carrier frequency or other factors are changed. Evidently, the presence of such undesirable effects within the driver itself is extremely troublesome in that they may entirely mask the resonance effect it is desired to detect and to measure.

SUMMARY OF THE INVENTION

The present invention provides a precision ultrasonic or electromechanical transducer that employs a piezoelectric driver element excited by pulsed carrier electrical signals. It generates within its interior a propagating ultrasonic wave focused in acoustically matched relation by a metal plano-concave lens through a liquid medium for collimated flow into a metal output coupler rod and into the external element to be excited. Means are provided for filling the internal cavities of the instrument with a liquid medium that propagates ultrasound waves in a desired mode, suppressing undesired mode propagation. As an aid in filling the apparatus with the liquid medium, an arrangement for purging trapped gas is also supplied.

DESCRIPTION OF THE PREFERRED EMBODIMENTS

Figure 2:
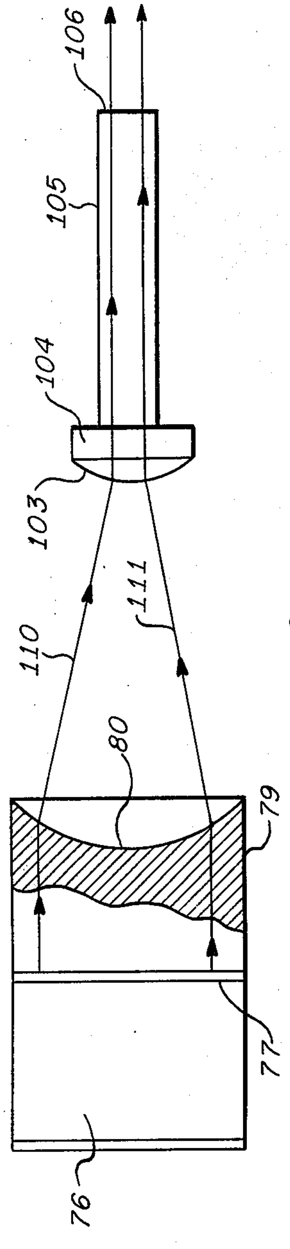
FIG. 2 is a plan view of certain elements isolated from FIG. 1 for purposes of explaining operation of the invention.
Figure 1:
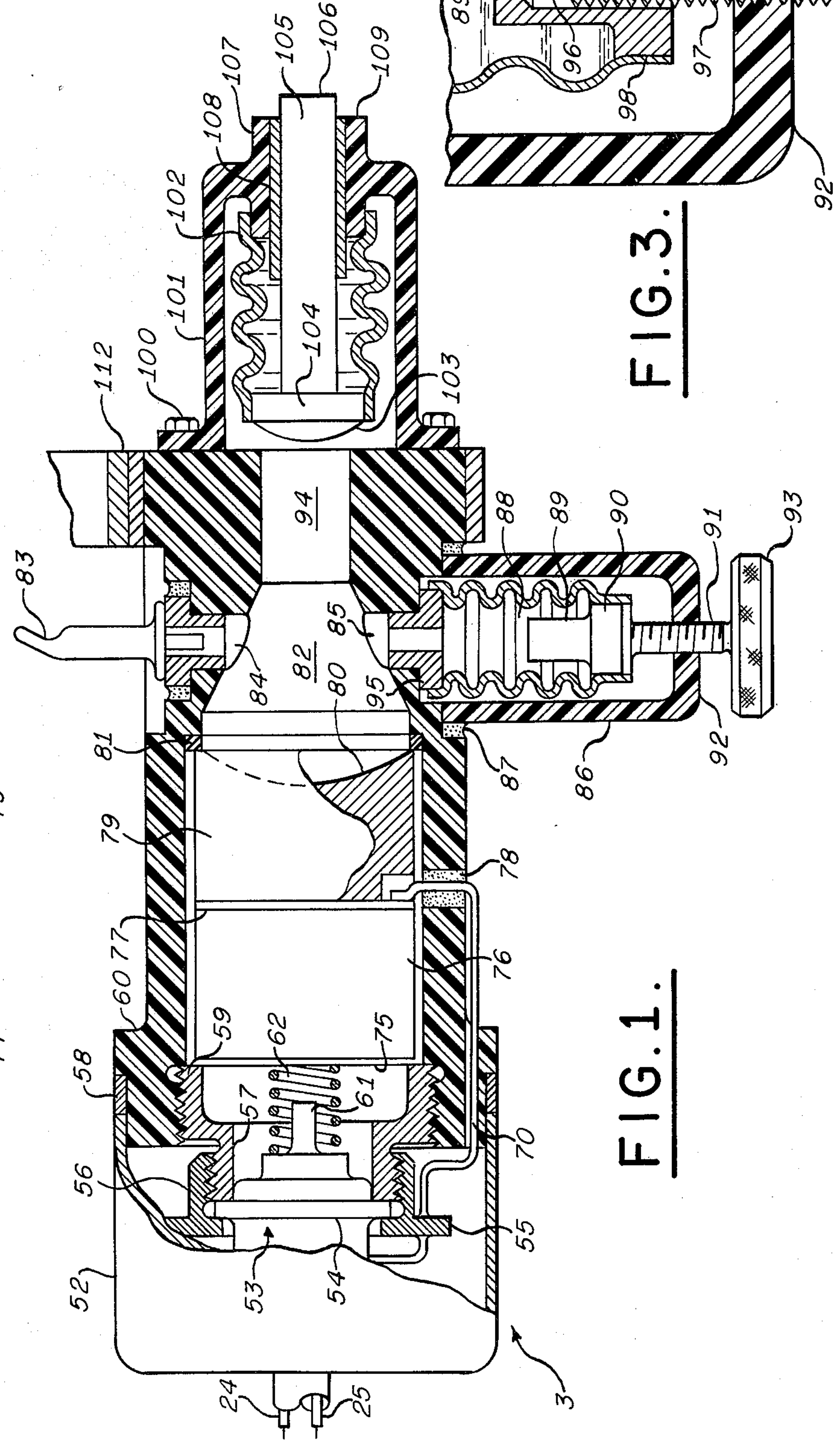
FIG. 1 is a plan view of the novel ultrasonic driver in partial cross-section.

The novel electromechanical ultrasonic driver 3 is shown in detail in FIGS. 1 and 2, the latter figure providing an isolated view of certain of the elements essential to the generation and propagation of the high frequency sound waves, as will be further explained. Referring particularly to FIG. 1, the electrical leads 24 and 25 are coupled to a conventional pulse generator (not shown) of the general type often employed with prior art ultrasonic drivers. A conventional pulsed-power variable carrier frequency oscillator is useful, such as a device for generating sharp carrier frequency pulses of duration adjustable from, for example, two to 100 microseconds at pulse amplitudes of the order of 100 volts or more and pulse repetition rates of 50 to 1,000 pulses per second. The pulsed driver oscillator may be internally triggered in a conventional manner.

In FIG. 1, leads 24 and 25 enter the protective casing 52, the interior of which supports a coaxial transmission line fitting 53 having a flanged portion 54. Flanged portion 54 is fixedly supported by the threaded ring clamp 55 so that the inner conductor 61 of coaxial line fitting 53 is urged against spring 62. The threaded ring clamp 55 is held by threads 56 on the doubly threaded ring element 57 which is, in turn, supported in the main body 60 of the driver on the internal threads 59. The protective casing 52 covering transmission line fitting 53 is sealed at 58 to the body 60 by any convenient sealant.

The main body 60 of the instrument is provided with a generally hollow axial cavity for accommodating active elements for performing several functions. The first novel feature of the cavity region lies in the support of a solid piezoelectric circular cylinder 76. Cylinder 76 is equipped on its opposite flat sides with thin electrically conducting films 75 and 77, which may, for example, be made of silver or other electrically conducting materials by conventional fabrication methods, such as by metal evaporation. The cylinder 76 is preferably constructed of a lead zirconate-titanate compound well known to have suitable piezoelectric characteristics and generally known on the market by the designation PZT-4, though other materials may be substituted. The pulsed signals from the electrical pulse generator are applied via leads 24 and 25 through spring 62 and via lead 70 through seal 78 to the respective opposed thin film electrodes 75 and 77.

The piezoelectric material of cylinder 76 is polarized in such a manner as to produce bidirectional axial strains when an alternating potential is applied to electrodes 75, 77. This axial strain produces face waves flowing into the end of lens 79 contacting electrode 77. The opposite face of cylinder 76 at electrode 75 is clamped by ring member 57 surrounding a cavity volume so as to provide support of the piezoelectric cylinder 76 without diminishing the intensity of the developed strain.

For purposes of focusing the ultra sound waves generated by piezoelectric cylinder 76, a converging plano-concave lens 79 of aluminum and of generally cylindrical shape is provided with a concave front surface 80. Generally cylindrical in shape like cylinder 76, lens 79 is held in place against the thin film electrode 77 at the radiating surface of cylinder 76, being compressed against the annular seal 81. The planar surface of the aluminum lens 79 is preferably lapped and cemented to film 77, the two flat surfaces of cylinder 76 also having been smoothly lapped prior to the installation of electrodes 75 and 77. The cement used to fasten lens 79 to the film 77 may be a commercially available epoxy resin providing a close acoustical impedance match between the ceramic of cylinder 76 and the aluminum material of lens 79 and also closely matching the thermal expansion coefficients of these materials.

Materials of the type preferred for use in forming piezoelectrical cylinder 76 may tend to generate objectionable abnormal mode surface waves propagating normal to the desired direction of acoustical energy propagation. For this reason, among others yet to be discussed, a fluid interface coupling region 82 is provided, because the undesired shear waves tend to be attenuated within the liquid and are therefore not undesirably propagated. Furthermore, it is desired to concentrate the energy emanating from the concave surface 80 to flow through a relatively small cross-section area because such an arrangement facilitates putting maximum energy into a small surface area of a device or element to be excited. The fluid interface volume 82, 94 is supplied primarily by the generally conical cavity portion 82 and the continuing cylindrical cavity portion 94 and these volumes are filled with glycerin. With the cavity portions 82 and 94 and the space in front of concave surface 80 filled with glycerin, the acoustic path is focused in a converging manner toward the spherical input surface 103, in the general way shown most clearly in FIG. 2. Here, the extremum rays 110, 111 of the ultra sound beam emanating from the piezoelectric cylinder 76 are seen to be focused by the plano-concave lens 79 toward the convex input surface 103 as they pass through the coupling cavities 82, 94. The rays 110, 111 impinge upon the front surface 103 of the coupler rod 105, which may be constructed of steel. Because of the curved convex face 103, the rays 110 and 111 are collimated and run as parallel rays with parallel wave fronts through the steel coupler rod 105. An object placed against the face 106 of coupler rod 105 is thus desirably subjected to pulses of oscillatory ultrasonic energy. A drop of glycerin may be placed on the coupler rod face 106 to furnish a close impedance match between the steel coupler rod 105 and a surface of the element to be excited by ultrasonic energy for test or other purposes. When in use, rod 105 is depressed by contact force with the object to be excited until its active face 106 is flush with the face 109 of flange 107. When rod 105 is so positioned, the surfaces 80 and 103 of the associated lenses are focused properly to assure maximum energy transfer through the system and out through rod 105. This arrangement assures the existence of a fixed and suitable contact force of the face 106 against the object under test, with no degradation of performance and no introduction of operator error.

The high quality steel coupler rod 105 is supported within a glycerin-filled extension of cavity 94 enclosed by casing 101 affixed to the end of body 60 by fasteners such as screw 100. Concentrically mounted in casing 101 on a flange 107 is a flexible bellows 102 enclosing the steel coupler rod 105 and sealed thereto at the circumferential face 104 adjacent its front convex surface 103. The volume within casing 101 and exterior of coupler rod 105 is also filled with glycerin, that within bellows 102 simply enclosing air. Coupler rod 105 is supported by flange 107 in a hollow metal bushing 108 for free translation therein axially. Bushing 108 is affixed to flange 107 by a suitable adhesive. Thus, the acoustic energy is focused by aluminum lens 79 through the glycerin within cavities 82 and 94 in an acoustically matched path on through the fluid medium into the convex surface 103 of driver rod 105, wherein it propagates in the form of parallel rays through the outer surface 106 into the object to be excited. The body 60 of the instrument is adapted to be supported with respect to the object to be excited by a suitable rigid support such as illustrated generally at 112.

Elements branching radially from the cavity 82 are employed in introducing glycerin into the internal cavities of the ultrasonic driver and include a gas purging device and a sealing tube. The former consists of a casing 86 sealed at 87 within body 60 and containing a coaxially mounted bellows 88. Bellows 88 is affixed at its upper end to the circumferential face of a flanged member 95; member 95 is supplied within a bore 85 communicating between volume 82 and the interior of bellows 88. The opposed end of bellows 88 is sealed to the circumferential face at the flanged end 90 of a plunger or piston 89. So that piston 89 may be translated along its axis, a threaded rod 91 is held for manual rotation in the end 92 of casing 86, the threaded part of rod 91 cooperating with plunger or piston 89. Rotation of knob 93 on threaded rod 91 moves plunger 89 toward or away from cavity 82, urging liquid into it, or withdrawing liquid.

To prevent permanent entrapment of gas within the device interior, the bellows 88 is gradually compressed while the unit is actually operating with driving signals on leads 24, 25, until all entrained gas is expelled through the open pinch-off tube 83, located in bore 84 diametrically opposite the purging apparatus. When all entrained gases are expelled, tube 83 is sealed, the pinch-off tube 83 and its method of use being of the kinds conventionally used in vacuum tube and other arts. The fact that the body 60 of the driver and casing 101 are constructed of a transparent material such as a methacrylate permits the operator to observe visually the presence of entrapped gas and to tilt or otherwise manipulate the device so that such gas exits through the open pinch-off tube 83, after which tube 83 is sealed.

Figure 3:
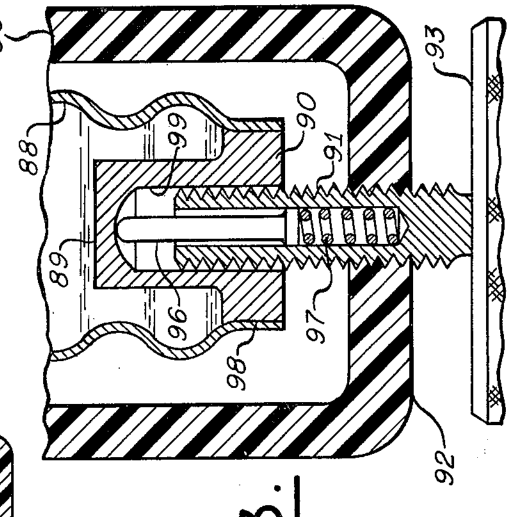
FIG. 3 is an enlarged plan view of part of FIG. 1.

In the preferred form of the purging device shown in FIG. 3, the piston 89 has an internal bore 99 with a curved or conical inner end, the piston having an outer flanged end 90 sealed to an end of bellows 88. A rod 91 with a thread mating a threaded bore passing through end 92 projects into bore 99 and is moved in or out of bore 99 by rotation of knob 93. An axial bore in threaded rod 91 accommodates one end of rod 96, the other rounded end of rod 96 being seated in the apex of the conical inner end of bore 99. The axial bore in threaded rod 91 additionally accommodates a helical spring 97 compressed in place by forces on the rounded head of rod 96. Operation of the FIG. 3 device is similar to that discussed in connection with Fig. 2. Adjustment of knob 93 is only partially attenuated by spring 97. Each time rod 105 is depressed toward cavity 94, glycerin is moved through bore 85 into bellows 88, tending to compress spring 97. Temperature changes are also accommodated in a similar manner, spring 97 acting as a yieldable element permitting flow of glycerin with respect to bellows 88 and chamber 82 over a desired range of operating temperatures.

Accordingly, it is seen that the invention is an ultrasonic electromechanical transducer employing a piezoelectric element excited by pulsed carrier electrical signals and generating a propagating ultra sound wave focused in acoustically matched relation by a metal plano-concave lens through a liquid medium for collimated flow into a metal output coupler rod and into an external element to be excited. Multiple reflections and resonance effects are avoided in the interior of the instrument so that they may not disturb measurements being made on objects under test. In view of the internal energy focusing system of the apparatus, considerable energy may be efficiently injected into a very small surface area of an object to be tested. Resonance effects in the object to be tested may readily be observed without fear of substantial interference due to multiple reflection or resonance effects within the interior of the ultrasonic driver itself.

While the invention has been described in its preferred embodiments, it is to be understood that the words which have been used are words of description rather than of limitation and that changes within the purview of the appended claims may be made without departing from the true scope and spirit of the invention in its broader aspects.

I claim:

1. An electromechanical transducer comprising:
piezoelectric driver means having a radiating surface for radiating ultrasonic waves,
acoustic lens means for receiving said radiated ultrasonic waves through a first surface,
said acoustic lens means having a second surface of concave shape for converging ultrasonic waves passing through said acoustic lens,
hollow container means for enclosing said piezoelectric driver means and said acoustic lens means,
said hollow container means defining an interior cavity extending from said concave second surface along the axis thereof, and
ultrasonic wave coupler means extending along said axis through said hollow container means and having a wave input face opposite said concave face within said interior cavity and a wave output face external of said hollow container means,
said interior cavity being filled with liquid for propagating said converging ultrasonic waves from said acoustic lens into said wave input face of said ultrasonic wave coupler means substantially without reflection.

2. Apparatus as described in claim 1 wherein said wave input face of said ultrasonic wave coupler means is convex for receiving said converging ultrasonic waves for flow within said ultrasonic wave coupler means in parallel wave front configuration.

3. Apparatus as described in claim 2 wherein said radiating surface of said piezoelectric driver means has bonded thereto first thin electrode means for cooperation with second thin electrode means on an opposed surface of said piezoelectric driver for applying an electric field therebetween.

4. Apparatus as described in claim 3 wherein said acoustic lens means has a planar surface opposite said concave surface at said first thin electrode means.

5. Apparatus as described in claim 2 wherein said interior cavity diminishes in diameter toward said ultrasonic wave coupler means wave input face.

6. Apparatus as described in claim 2 wherein the solid-liquid interface at said concave second surface of said acoustic lens means and the liquid-solid interface at said wave input face of said ultrasonic wave coupler means are acoustically impedance matched for minimizing multiple reflection and resonance effects within said interior cavity.

7. Apparatus as described in claim 6 wherein said liquid is glycerin.

8. Apparatus as described in claim 7 wherein said acoustic lens means is fabricated of aluminum.

9. An electromechanical transducer comprising:
piezoelectric driver means having a radiating surface for radiating ultrasonic waves, acoustic lens means for receiving said radiated ultrasonic waves through a first surface,
said acoustic lens means having a second surface of concave shape for converging ultrasonic waves passing through said acoustic lens,
hollow container means for enclosing said piezoelectric driver means and said acoustic lens means,
said hollow container means defining in interior cavity extending from said concave second surface along the axis thereof,
ultrasonic wave coupler means extending along said axis through said hollow container means and having a wave input face opposite said concave face within said interior cavity and a wave output face external of said hollow container means,
said wave input face of said ultrasonic wave coupler means being convex for receiving said converging ultrasonic waves for flow within said ultrasonic wave coupler means in parallel wave front configuration,
said ultrasonic wave coupler means being mounted in said hollow container means by flexible means permitting restricted translation along said axis of said ultrasonic wave coupler means,
said interior cavity being filled with liquid for propagating said converging ultrasonic waves from said acoustic lens into said wave input face of said ultrasonic wave coupler means substantially without reflection.

10. Apparatus as described in claim 9 wherein said ultrasonic wave coupler means extends beyond said hollow container means sufficiently that said wave output face of said ultrasonic wave coupler means may be contacted by an object under test.

11. An electromechanical transducer comprising:
piezoelectric driver means having a radiating surface for radiating ultrasonic waves,
acoustic lens means for receiving said radiated ultrasonic waves through a first surface,
said acoustic lens means having a second surface of concave shape for converging ultrasonic waves passing through said acoustic lens,
hollow container means for enclosing said piezoelectric driver means and said acoustic lens means,
said hollow container means defining an interior cavity extending from said concave second surface along the axis thereof,
ultrasonic wave coupler means extending along said axis through said hollow container means and having a convex wave input face opposite said concave face within said interior cavity and a wave output face external of said hollow container means,
said interior cavity being filled with liquid for propagating said converging ultrasonic waves from said acoustic lens into said wave input face of said ultrasonic wave coupler means substantially without reflection for flow within said ultrasonic wave coupler means in parallel wave front configuration,
sealable conduit means coupled through said hollow container means into said interior cavity for facilitating filling thereof with said liquid, and
adjustable volume control means coupled through said hollow container means into said interior cavity for controlling the volume of said liquid within said interior cavity when said sealable conduit means is open and consequently for ejecting gases from said interior cavity before said sealable conduit means is sealed.

12. Apparatus as described in claim 11 wherein said adjustable volume control means includes yieldable means operating when said sealable conduit means is sealed to permit axial translation of said ultrasonic wave coupler means.

13. Apparatus as described in claim 11 wherein said yieldable means is additionally so characterized as to permit use of a substantially incompressible fluid as said liquid over a range of operating temperatures.

* * * * *